(12) United States Patent
Umematsu et al.

(10) Patent No.: US 6,399,897 B1
(45) Date of Patent: Jun. 4, 2002

(54) MULTI-LAYER WIRING SUBSTRATE

(75) Inventors: Misao Umematsu; Shunichi Kikuchi; Kiyokazu Moriizumi; Kazuaki Satoh; Norikazu Ozaki, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/631,683

(22) Filed: Aug. 2, 2000

(30) Foreign Application Priority Data

Sep. 3, 1999 (JP) .......................................... 11-250795

(51) Int. Cl.$^7$ ................................................ H01R 9/09
(52) U.S. Cl. ..................... 174/261; 257/620; 257/737; 257/773; 257/774; 257/786
(58) Field of Search .................. 174/255, 261, 174/262; 257/773, 737, 774, 786, 620, 734, 692

(56) References Cited

U.S. PATENT DOCUMENTS

| | | | | |
|---|---|---|---|---|
| 5,220,199 A | * | 6/1993 | Owada et al. | 257/773 |
| 5,442,236 A | * | 8/1995 | Fukazawa | 257/773 |
| 5,763,936 A | * | 6/1998 | Yamaha et al. | 257/620 |
| 6,091,097 A | * | 6/2000 | Shintaku | 257/306 |
| 6,198,165 B1 | * | 3/2001 | Yamaji | 257/734 |

FOREIGN PATENT DOCUMENTS

| | | |
|---|---|---|
| JP | 7-15144 | 1/1995 |
| JP | 7-74175 | 3/1995 |
| JP | 9-139431 | 5/1997 |

* cited by examiner

Primary Examiner—Albert W. Paladini
(74) Attorney, Agent, or Firm—Armstrong, Westerman & Hattori, LLP

(57) ABSTRACT

A multi-layer wiring substrate includes a main substrate and a plurality of insulating films stacked on the main substrate. The plurality of insulating films have wiring patterns formed on wiring regions thereof and dummy wiring patterns formed on peripheral regions of the wiring regions. The wiring patterns include signal wiring patterns, power supply wiring patterns, and vias. The dummy wiring patterns correspond to the wiring patterns, respectively.

6 Claims, 7 Drawing Sheets

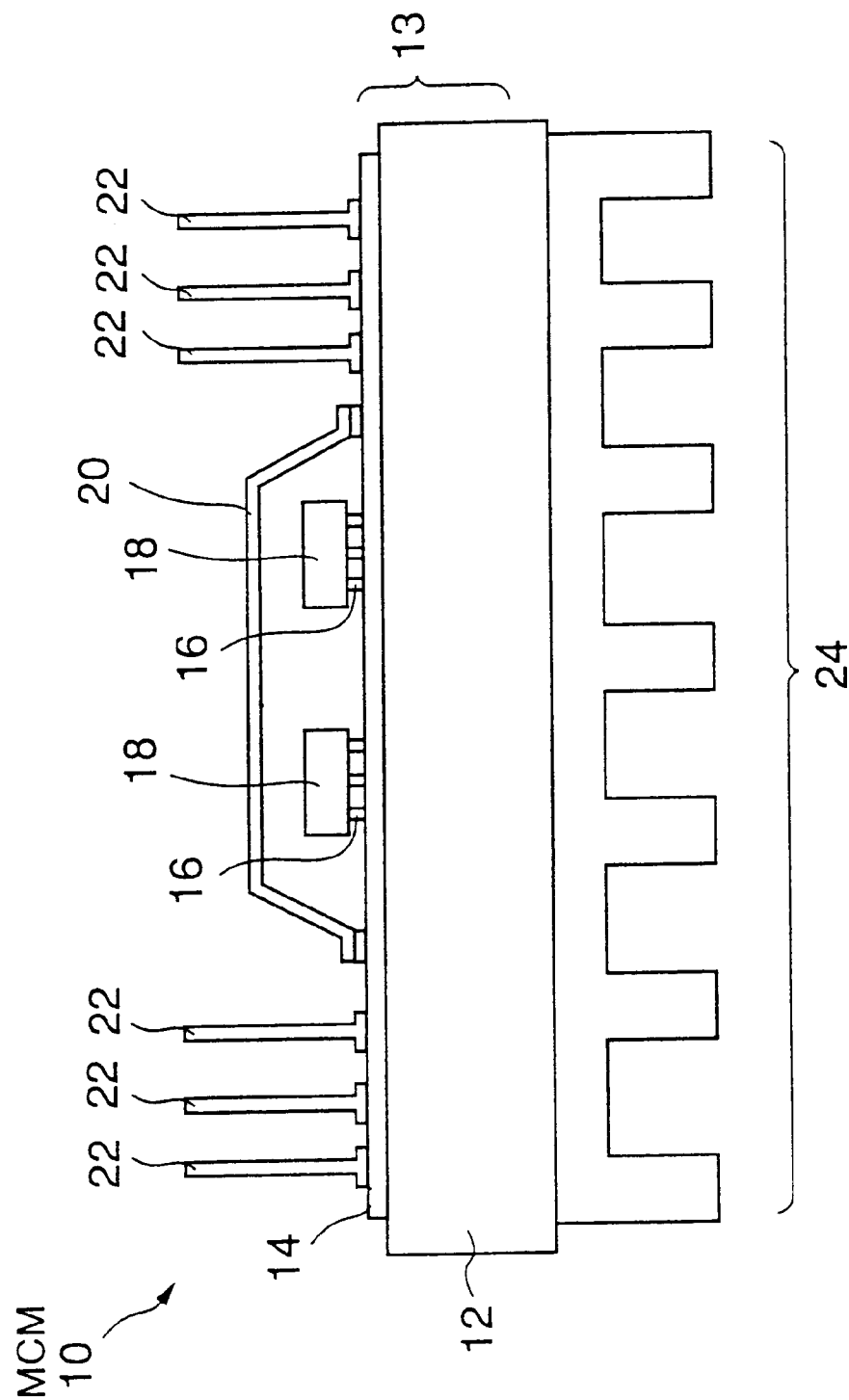

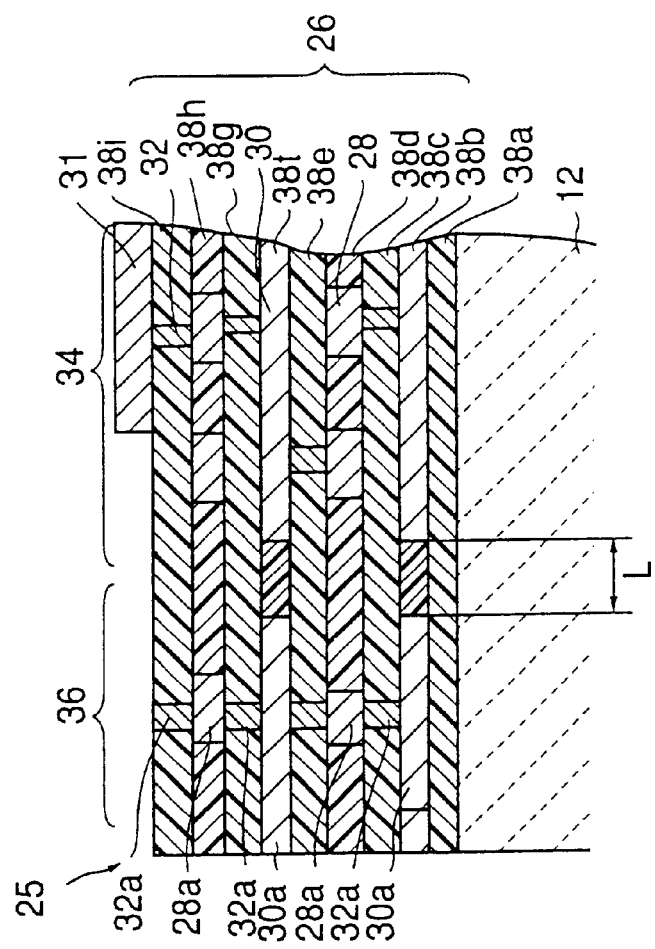
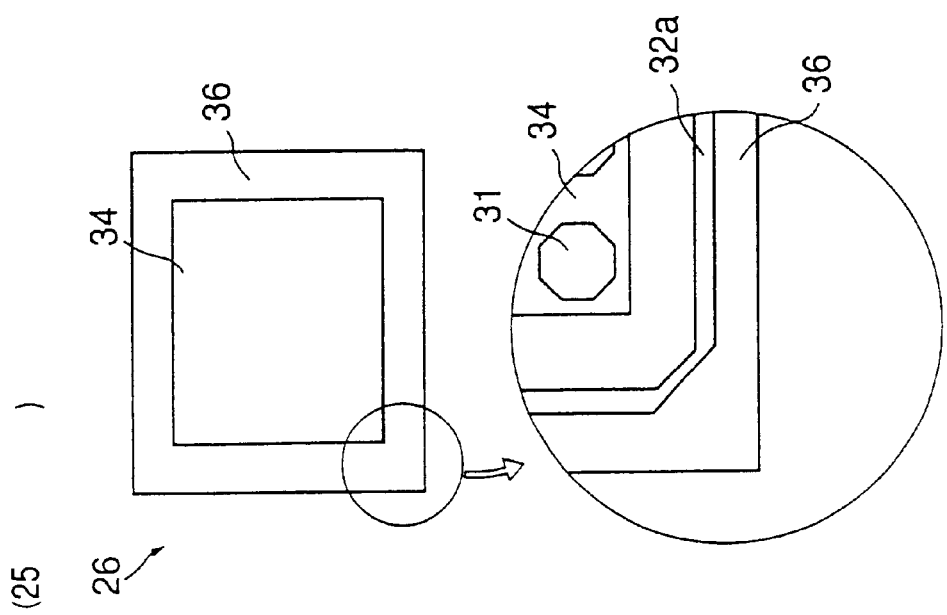

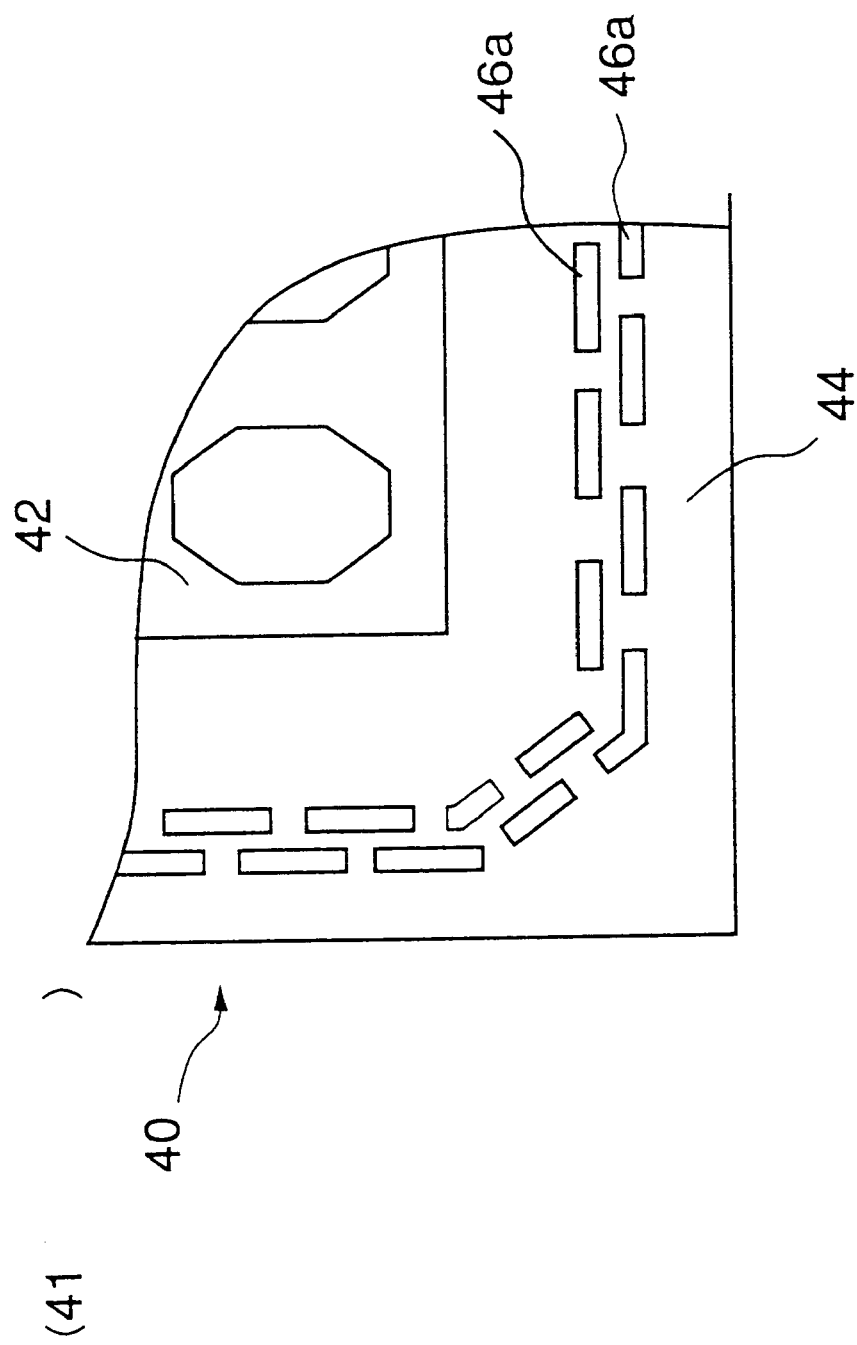

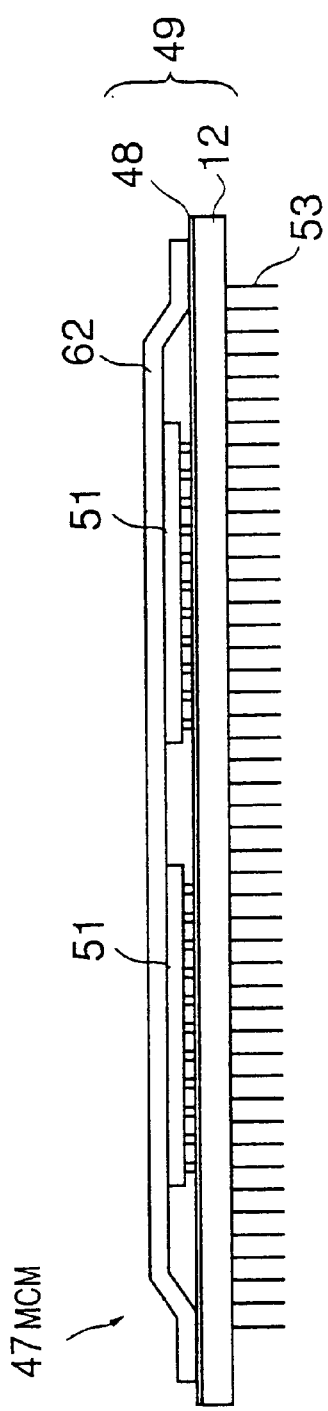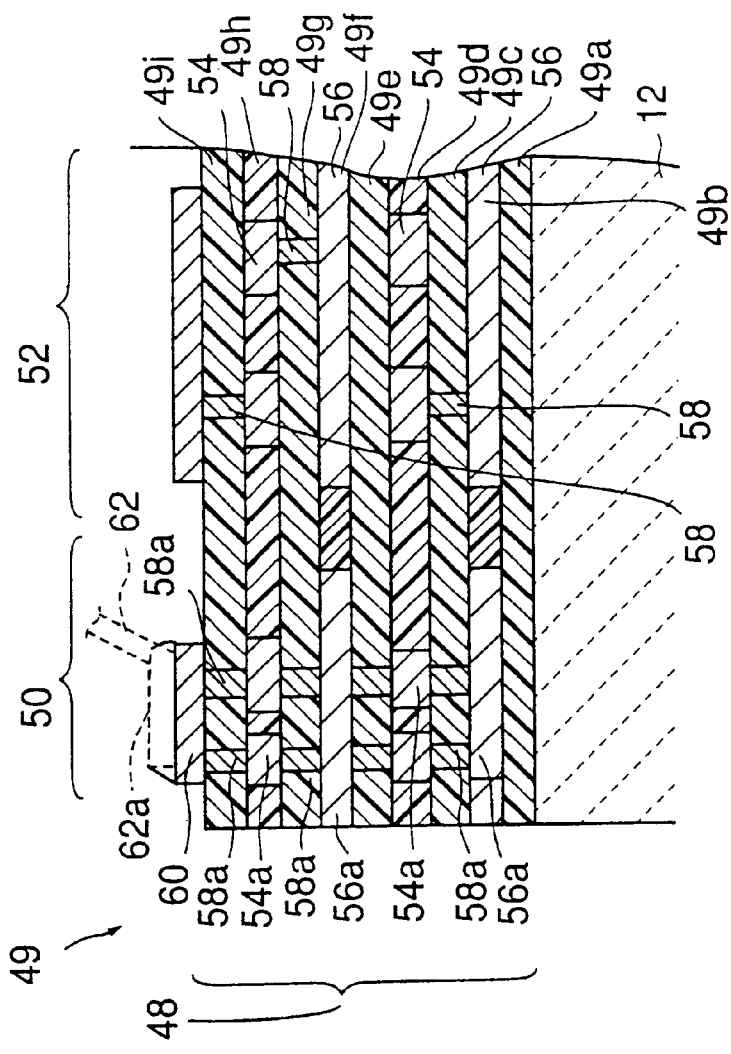
FIG. 5A
FIG. 5B

MULTI-LAYER WIRING SUBSTRATE

BACKGROUND OF THE INVENTION

1. Field of the Invention

The present invention generally relates to multi-layer wiring substrates which are used in, for example, Multi-Chip Modules (MCMs), and more particularly to a multi-layer wiring substrate having a multi-film wiring portion which is formed by stacking a plurality of films flatted accurately by means of a Chemical Mechanical Polishing (CMP) method.

2. Description of the Related Art

In recent years, with the increase of high density and the number of leads of Large Scale Integrated (LSI) semiconductor dice, substrates for interconnecting these dice need to be manufactured with high density as well.

In order to manufacture a multi-layer wiring substrate that can support the above-mentioned situation, there is a well-known method where the multi-layer wiring substrate is manufactured by mounting a multi-film wiring portion on a main substrate thereof.

Conventionally, in a case of forming the multi-film wiring portion, there is a strong possibility that a step may be formed between a wiring region where wires are laid and an unwiring region where wires are not laid. Since the step may cause the breaking of the wires laid therein, it should be eliminated so that each of the films can be flatted accurately.

Further, the CMP is well known as a method of flatting the films accurately, where only convex portions on the films are selected and then polished by a polishing pad while polishing liquid containing silica particles is introduced.

FIG. 1 is a cross-sectional diagram for illustrating a conventional process using the CMP for manufacturing a multi-layer wiring substrate. In this diagram, 1a through 1g denote stacked films, 2a through 2d denote wires, 3 denotes a wiring region where the wires 2a through 2d are laid, 4 denotes a soft peripheral portion which surrounds the wiring region 3 and where no wires are laid, 5 denotes a main substrate on which the stacked films 1a through 1g are mounted, and 6 denotes a multi-film wiring portion 6 which is formed by the stacked films 1a through 1g.

As shown in FIG. 1, however, when the films 1a through 1g are each accurately polished by means of the CMP, the soft polishing pad is deformed and stuck to an insulating film of the soft peripheral portion 4. Thereby, the peripheral portion 4 is thus deeply polished and a step between the peripheral portion 4 and the wiring region 3 is generated on each of the films 1a through 1g. If the films 1a through 1g are stacked as they are to form the multi-film wiring portion 6, then the peripheral portions 4 thereof are deformed and hung down, and the wires 2a through 2d laid therein may contact each other (see a state shown by "a" in FIG. 1).

The contacting of the wires is highly undesirable because shoring may occur as a result of mounting the thus-configured multi-film wiring portion on the main substrate 5 to form a multi-layer wiring substrate.

Furthermore, since the peripheral regions 4 of the stacked films 1a through 1g are thus polished and deformed, outside moisture cannot be effectively protected for invading the wiring regions 3 of the stacked films 1a through 1g. As a result, characteristics of the multi-layer wiring substrate are degraded.

SUMMARY OF THE INVENTION

It is a general object of the present invention to provide a multi-layer wiring substrate, in which the above disadvantages can be overcome.

Another and a more specific object of the present invention is to provide a multi-layer wiring substrate having a plurality of stacked films which are flatted accurately by means of a Chemical Mechanical Polishing (CMP) method.

The above objects and other objects of the present invention are achieved by a multi-layer wiring substrate comprising:

a main substrate; and a plurality of insulating films stacked on said main substrate, said insulating films having wiring patterns formed on wiring regions thereof and dummy wiring patterns formed on peripheral regions of said wiring regions.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIG. 2 is a front view schematically showing a Multi-Chip Module (MCM) where a multi-layer wiring substrate in accordance with the present invention is used;

FIGS. 3A and 3B are diagrams showing a multi-layer wiring substrate of a first embodiment according to the present invention, FIG. 3A including a view schematically showing the multi-layer wiring substrate and an enlarged view showing part of the same, FIG. 3B being a schematic cross-sectional view of the part of the multi-layer wiring substrate in FIG. 3A;

FIG. 4 is a plan view partly showing a multi-layer wiring substrate of a second embodiment according to the present invention;

FIGS. 5A and 5B are diagrams showing a multi-layer wiring substrate of a third embodiment according to the present invention, FIG. 5A schematically showing a front view of a MCM in which the multi-layer wiring substrate is installed, FIG. 5B schematically showing a cross-sectional view of part of the multi-layer wiring substrate in FIG. 5A;

DETAILED DESCRIPTION OF THE PREFERRED EMBODIMENTS

Figure 1:
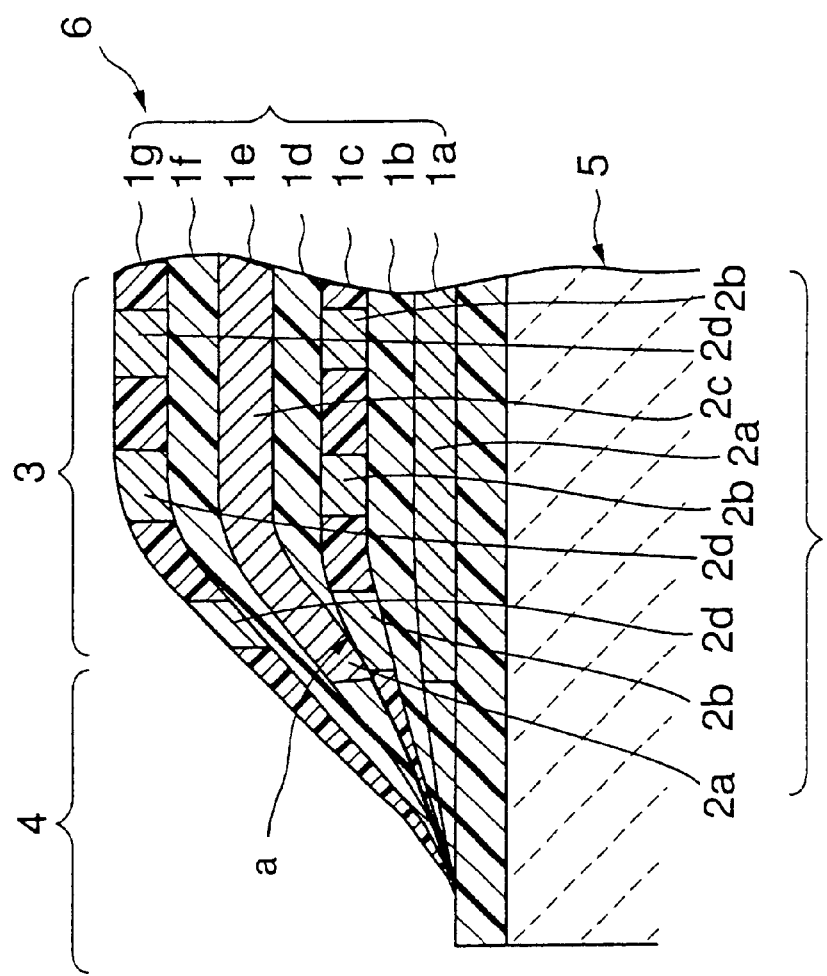
FIG. 1 is a cross-sectional view showing a peripheral region of a conventional multi-layer wiring substrate, an insulating film of which is polished by means of a CMP method.

With reference to the drawings, preferred embodiments of the present invention will be described below.

First, with reference to FIG. 2, a description is given of a Multi-Chip Module (MCM) in which a multi-layer wiring substrate in accordance with the present invention is used. In addition, a MCM 10 shown in FIG. 2 is positioned inversely so as to correspond to multi-layer wiring substrates shown in the other diagrams.

As shown in FIG. 2, the MCM 10 comprises a multi-layer wiring substrate 13 having a main substrate 12 and a multi-film wiring portion 14, which is provided on a first surface of the main substrate 12. The main substrate 12 may be made of, for example, a silicon material, or a metal material such as aluminum nitride, molybdenum or the like. The multi-film wiring portion 14 may be made of a conductive material such as copper or the like and an insulation material such as polyimide or the like. On the uppermost film of the multi-film wiring portion 14, there are provided a plurality of electrode pads (not shown) on which a plurality of flip chips (two shown in FIG. 2) 18 are mounted via a plurality of ball electrodes 16. Further, the flip chips 18 are covered by a frame body 20 around which a plurality of I/O pins 22 are extended upward via the electrodes. In addition, on a second surface of the main substrate 12, there are provided a plurality of fins 24.

In this configuration of the MCM 10, since the flip chips 18 are mounted with high density, delay of signals delivered between integrated circuits therein can be reduced and high speed of the whole system thereof can be realized.

Next, a description is given below with respect to a multi-layer wiring substrate 25 of a first embodiment of the present invention, with reference to FIGS. 3A and 3B.

FIG. 3A includes a schematic view of the multi-layer wiring substrate 25 and an enlarged view showing part thereof. FIG. 3B is a schematic cross-sectional view of the multi-layer wiring substrate 25.

As shown in FIGS. 3A and 3B, the multi-layer wiring substrate 25 includes a multi-film wiring portion 26 and the main substrate 12. The multi-film wiring portion 26 is formed by a plurality of stacked films 38a through 38i. Each of the stacked films 38a through 38i is made of an insulator and includes a wiring region 34 and a peripheral region 36 surrounding the wiring region 34.

In the wiring regions 34, a signal wiring pattern 28, a power supply wiring pattern 30, and vias 32 may be provided. In the peripheral regions 36, these patterns 28, 30, and the vias 32 are not provided. Herein, the thickness of each of the films 38a through 38i is set to, for example, approximately 3 $\mu$m through 30 $\mu$m. The width of a conductor of the signal wiring pattern 28 is set to, for example, approximately 2 $\mu$m through 30 $\mu$m.

Further, in the peripheral regions 36, a dummy signal wiring pattern 28a, a dummy power supply wiring pattern 30a, and a dummy via 32a may be provided around the wiring regions 34. The dummy signal wiring pattern 28a, dummy power supply wiring pattern 30a, and dummy via 32a correspond to the signal wiring pattern 28, the power supply wiring pattern 30, and the via 32, respectively. Dummy signal wiring pattern 28a is in the same stacked layer as the signal wiring pattern 28; dummy power supply wiring pattern 30a is in the power supply wiring pattern 30; and dummy vias 32a is in the same stacked layer as via 32. The width of the conductor material of the dummy signal wiring pattern 28a is set to approximately 100 $\mu$m, the dummy power supply wiring pattern 30a is set to approximately 1 $\mu$m, and the dummy via 32a is set to approximately 70 $\mu$m. Accordingly, in this case, an interval L between the dummy power supply wiring pattern 30a and the power supply wiring pattern 30 is, for example, approximately 300 $\mu$m, so that the dummy power supply wiring pattern 30a and the power supply wiring pattern 30 can be arranged adjacently to each other. The dummy wiring patterns and vias do not function to conduct signals or power, but function to prevent forming steps during CMP polishing (see FIG. 1) by preventing the polishing pad from entering the insulating film of the peripheral region 36.

In addition, a reference numeral 31 in FIGS. 3A and 3B denotes a base electrode.

In this configuration of the multi-layer wiring substrate 25 of the first embodiment, when the films 38a through 38i of the multi-film wiring portion 26 are accurately flatted by means of a polish method such as the CMP or the like, since the dummy signal wiring pattern 28a, the dummy power supply wiring pattern 30a, and the dummy vias 32a are provided in the peripheral regions 36 thereof, the films 38a through 38i can be accurately flatted and will not be deformed such that the polishing pad is deformed and stuck to the peripheral regions 36 which is thereby polished deeply.

Further, in this configuration, no shorting occurs when the multi-layer wiring substrate 25 is in use.

Also, since the dummy power supply wiring pattern 30a and the power supply wiring pattern 30 are arranged to be adjacent to each other, the polishing pad will not enter insulating portions existing in the interval therebetween. As a result, the insulating portions can be certainly flatted as well.

Furthermore, in this configuration, since the outside moisture can be prevented from invading the wiring regions 34 via insulating portions of the peripheral region 36, the characteristics of the multi-film wiring portion 26 will not be degraded.

In addition, the multi-film wiring portion 26 is manufactured such that on a larger substrate material, there are simultaneously formed a plurality of multi-film wiring portion, and the larger substrate material is diced by a dicing device along the peripheral regions 36 of these multi-film wiring portions so as to form each individual multi-film wiring portion 26. Thus, even if there are cracks in the diced multi-film wiring portions 26, the cracks will not exist on the wiring regions 34 of the diced multi-film wiring portions 26. As a result, reliability of the multi-film wiring portion 26 can be improved.

Next, a description is given below with respect to a multi-layer wiring substrate 41 of a second embodiment according to the present invention, with reference to FIG. 4.

FIG. 4 is a plan view partly showing the multi-layer wiring substrate 41 of the second embodiment. As shown in FIG. 4, there are a wiring region 42 and a peripheral region 44 on a multi-film wiring portion 40 of the multi-layer wiring substrate 41. On the peripheral region 44, there are two dummy signal wiring patterns 46a whose conductors intermittently surrounding the wiring region 43. It should be noted that, although not shown in FIG. 4, the dummy signal wiring patterns, dummy power supply wiring patterns, or dummy vias are be formed in each film of the multi-film wiring portion 40 (refer to FIG. 5).

In this configuration of the multi-layer wiring substrate 41 of the second embodiment, the multi-film wiring portion 40 can be manufactured more easily with a fewer load of the CMP, and particularly, no shorting occurs when the multi-layer wiring substrate 41 is in use because the peripheral region 44 can be flatted without deformation.

Next, a description is given below with respect to a multi-layer wiring substrate 49 of a third embodiment according to the present invention, with reference to FIGS. 5A and 5B.

FIG. 5A schematically shows a front view of a MCM 47 in which the multi-layer wiring substrate 49 is installed. FIG. 5B schematically shows a cross-sectional view of part of the multi-layer wiring substrate 49 in FIG. 5A.

As shown in FIG. 5A, the MCM 47 includes the multi-layer wiring substrate 49 having a multi-film wiring portion 48 and the main substrate 12, the multi-film wiring portion 48 mounted on a first surface of the main substrate 12. On the multi-film wiring portion 48, there are mounted a plurality of flip chips 51 (two in FIG. SA) which are encapsulated by a frame body 62. In addition, a plurality of I/O pins 53 are extended from a second surface of the main substrate 12.

As shown in FIG. 5B, on the other hand, the multi-film wiring portion 48 is formed by a plurality of stacked films 49a through 49i, each having a wiring region 52 and a peripheral region 50. In the peripheral regions 50 of these films 49a through 49i, two streaks of dummy signal wiring patterns 54a, dummy power supply wiring patterns 56a, and dummy vias 58a are formed correspondingly to signal wiring patterns 54, power supply wiring patterns 56, and vias 58 which are formed in the wiring regions 52, so as to surround the wiring regions 52. Further, in this case, on the uppermost film of the multi-film wiring portion 48, conductors 60 are provided so as to cover the two streaks of the dummy vias 58a.

In this configuration, when the multi-layer wiring substrate 49 of the third embodiment is installed in the MCM 47, by sticking an end portion 62a of the frame body 62 to the conductors 60 via an adhesive layer, the outside moisture can be prevented from invading the flip chips 51.

Next, a description is given below with respect to a multi-layer wiring substrate 65 of a fourth embodiment according to the present invention, with reference to FIGS. 6A and 6B.

Figure 6A:
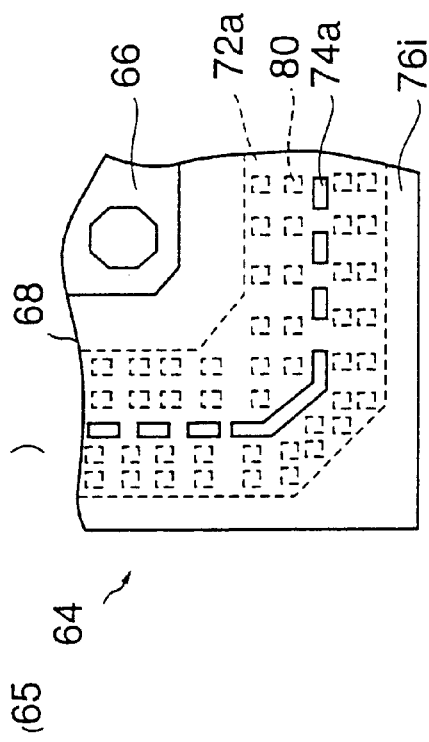
FIGS. 6A and 6B are diagrams showing a multi-layer wiring substrate of a fourth embodiment according to the present invention, FIG. 6A schematically showing a plan view of part of the multi-layer wiring substrate, FIG. 6B schematically showing a cross-sectional view of the part of the multi-layer wiring substrate in FIG. 6A.

FIG. 6A schematically shows a plan view of part of the multi-layer wiring substrate 65. FIG. 6B schematically shows a cross-sectional view of the part of the multi-layer wiring substrate 65 in FIG. 6A.

As shown in FIG. 6A, a multi-film wiring portion 64 of the multi-layer wiring substrate 65 is formed by a plurality of stacked films 76a through 76i each having a wiring region 66 and a peripheral region 68. On the uppermost film 76i of the multi-layer wiring substrate 65, dummy vias 74a are provided on the peripheral region 68 thereof such that the dummy vias 74a intermittently surround the wiring region 64 thereof. Further, on the lower film 76b of the multi-layer wiring substrate 65, a dummy power supply wiring pattern 72a is provided so as to surround the wiring region 64 thereof. The dummy power supply wiring pattern 72a has a plurality of fine holes 80 formed thereon.

Figure 6B:
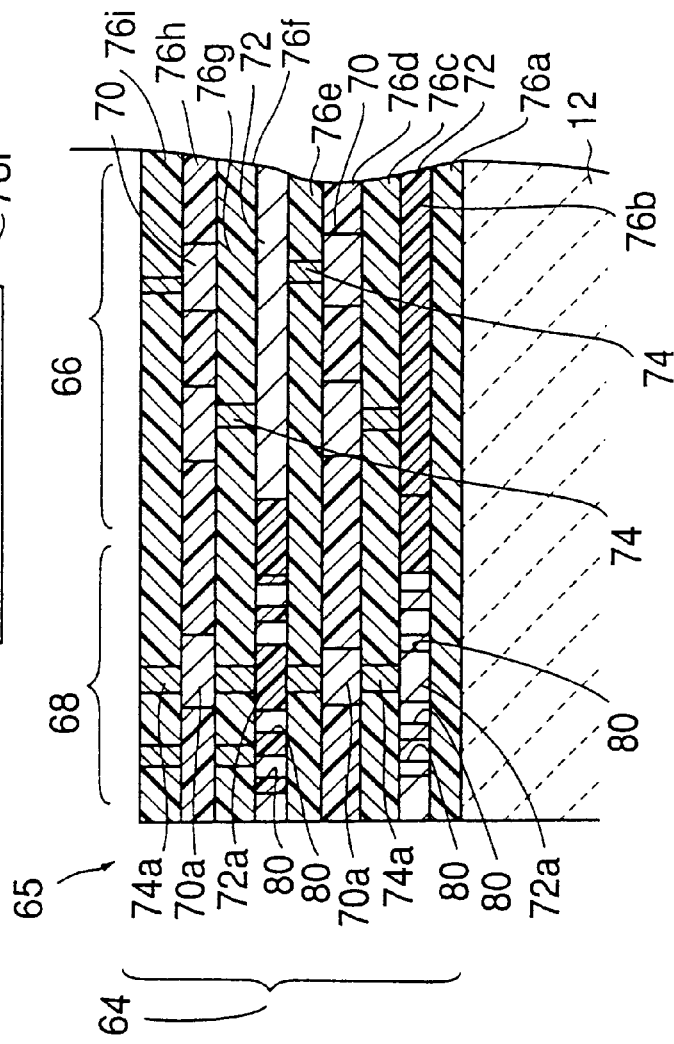

As shown in FIG. 6B, on the other hand, on the wiring regions 64 of the films 76a through 76i, there are provided signal wiring patterns 70, power supply wiring pattern 72, and vias 74. On the peripheral regions 68 of the films 76a through 76i, there are provided dummy signal wiring patterns 70a, the dummy power supply wiring pattern 72a, and the dummy vias 74a, which correspond to the signal wiring patterns 70, the power supply wiring pattern 72, and the vias 74, respectively. Furthermore, on places where the dummy power supply wiring patterns 72a are not joined to the dummy vias 74, there are formed the plurality of fine holes 80 each with a diameter of approximately 50 μm.

In this configuration of the multi-layer wiring substrate 65 of the fourth embodiment, gas, which is generated during the forming of the films 76a through 76i made of the insulators, can be diffused via the fine holes 80, and thereby the dummy power supply wiring patterns 72a will not be deformed by gas pressure.

In order to manufacture the previously described multi-layer wiring substrates of the first through fourth embodiments, the photolythography technology should be used. For example, a main substrate, which is made of the silicon material, or a metal material such as aluminum nitride, alumina, molybdenum or the like, is formed at first. Then, a power metallization patterning layer is formed such that a layer, for example, a copper layer is formed by means of a sputtering method or a sputtering-and-plating method. After that, resist is applied to the copper layer and part of the resist is removed from predetermined places on the copper layer by exposition and development so that the copper layer is processed by a etching process, and then the rest of the resist is removed therefrom. Thus, a power supply wiring pattern and a land are formed. Further, by repeating the above-described processing, vias can be formed on the power supply wiring pattern and the land so as to connect to upper layers. Finally, polyimide resin is applied thereto by a spin coat process so as to form an insulating film.

With respect to the signal metallization patterning layer, the forming thereof is the same as that of the power metallization patterning layer. That is, a copper layer is formed by the sputtering method, then the resist is applied thereto and part of the resist is removed from predetermined places on the copper layer by exposition and development, and after that the copper plating process is performed. Thus, a signal wiring pattern and a land are formed. Further, the resist is applied to the signal wiring pattern and the land again, then the exposition and development is performed so that part of the resist is removed from predetermined places, and after that the copper plating process is performed. Thus, the vias are formed. Furthermore, the polyimide resin is applied thereto by the spin coat process so as to form the insulating film.

It should be noted that the dummy vias mounted upon the dummy power supply wiring pattern and the land and the dummy vias mounted upon the dummy signal wiring pattern and the land in the peripheral regions, are simultaneously formed with the power supply wiring pattern and the signal wiring pattern in the wiring regions.

Herein, a description is given below with respect to how to accurately flat each film by means of the CMP, based on a film where the signal wiring pattern and the dummy signal wiring patter are provided for an example, with reference to FIGS. 7A through 7C.

Figure 7A:
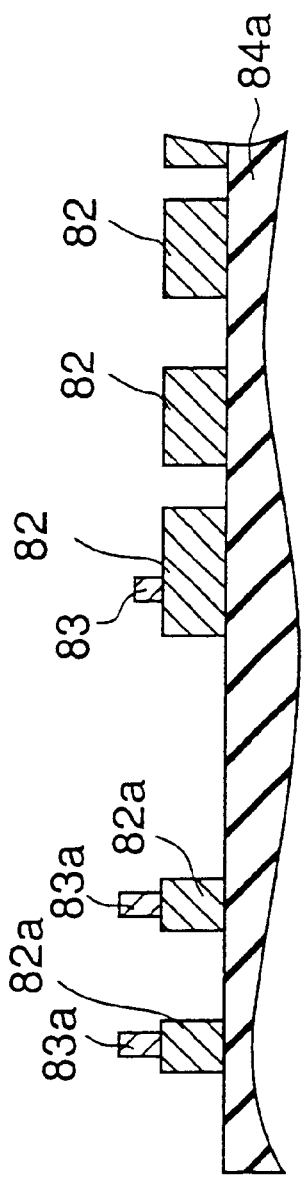
FIGS. 7A through 7C are diagrams illustrating procedures for flatting an insulating film by means of CMP in manufacture of a multi-layer wiring substrate in accordance with the present invention, FIG. 7A showing a state of a signal wiring pattern being formed on the insulating film, FIG. 7B showing a state of a polyimide resin being applied to the signal wiring pattern, FIG. 7C showing a state of the insulating film being polished by the CMP.

FIG. 7A shows a state of the signal wiring pattern being formed on an insulating film. FIG. 7B shows a state of the polyimide resin being applied to the signal wiring pattern. FIG. 7C shows a state of the insulating film being polished by the CMP. Reference numeral 84a denotes the insulating film having a wiring region 86 and a peripheral region 88.

As shown in FIG. 7A, a signal pattern 82 is formed on the wiring region 86 and a dummy signal pattern 82a is formed on the peripheral region 88, by sputtering copper on holes which are formed by performing a photolythograph process for a resist film (not shown) formed on the insulating film 84a, and thereafter the rest of the resist is removed therefrom. The signal pattern 82 and the dummy signal pattern 82a are formed protruding form the insulating film 84a. Further, vias 83 are formed on the signal wiring pattern 82 and dummy vias 83a are formed on the dummy signal wiring pattern 82a.

Figure 7B:
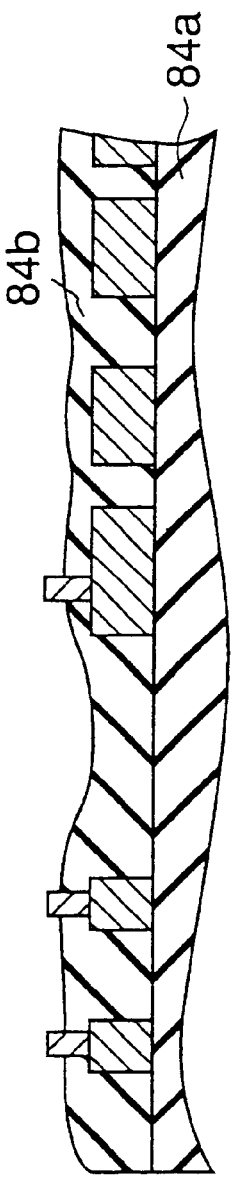

Next, as shown in FIG. 7B, a polyimide resin film 84b is applied to the insulating film 84a. At this time, the polyimide resin film 84b is formed to be uneven so that insulating parts of both the signal wiring pattern 82 and the dummy signal wiring pattern 82a become relatively convex.

Figure 7C:

Finally, as shown in FIG. 7C, the polyimide resin film 84b is flatted by the CMP. At this time, unlike the conventional case in which the peripheral region 4 is deformed because of being deeply polished, according to the embodiments of the present invention, since the dummy signal wiring pattern 82a and the dummy via 83a are provided in the peripheral region 88, the polishing pad cannot enter the insulating film of the peripheral region 88. As a result, the peripheral region 88 is thereby flatted without deformation.

The above description is provided in order to enable any person skilled in the art to make and use the invention and sets forth the best mode contemplated by the inventors for carrying out their invention.

The present application is based on Japanese priority application No. 11-250795 filed on Sep. 3, 1999, the entire contents of which are hereby incorporated by reference.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A multi-layer wiring substrate, comprising:

a main substrate; and a plurality of insulating films stacked on said main substrate;

said insulating films have wiring patterns formed on wiring regions thereof and dummy wiring patterns formed on peripheral regions surrounding said wiring regions;

said wiring patterns include signal wiring patterns, power supply wiring patterns, and vias; and said dummy wiring patterns correspond to said wiring patterns, respectively.

2. The multi-layer wiring substrate as claimed in claim 1, wherein said dummy wiring patterns are provided in a continuous manner around said wiring regions on said peripheral regions.

3. The multi-layer wiring substrate as claimed in claim 1, wherein said dummy power supply wiring patterns are formed adjacently to said power supply wiring patterns.

4. A multi-layer wiring substrate, comprising:

a main substrate; and a plurality of insulating films stacked on said main substrate, said insulating films having wiring patterns formed on wiring regions thereof and dummy wiring patterns formed on peripheral regions surrounding said wiring regions, wherein said dummy wiring patterns are provided in an intermittent manner surrounding said wiring regions on said peripheral regions, said dummy wiring patterns correspond to said wiring patterns of said wiring regions.

5. A multi-layer wiring substrate, comprising:

a main substrate; and a plurality of insulating films stacked on said main substrate, said insulating films having wiring patterns formed on wiring regions thereof and dummy wiring patterns formed on peripheral regions surrounding said wiring regions, wherein said dummy wiring patterns have at least two streaks of dummy wiring patterns formed on said peripheral regions;

said two streaks of dummy wiring patterns correspond to said wiring patterns of said wiring region; and at a peripheral region of an uppermost one of said insulating films, said dummy wiring patterns are interconnected by conductors formed thereon.

6. A multi-layer wiring substrate, comprising:

a main substrate; and a plurality of insulating films stacked on said main substrate, said insulating films having wiring patterns formed on wiring regions thereof and dummy wiring patterns formed on peripheral regions surrounding said wiring regions, wherein said power supply wiring patterns include a plurality of fine holes, and said fine holes are formed on places where power supply wiring patterns are not joined to dummy via.

* * * * *